(12) United States Patent
Karmaker

(10) Patent No.: US 10,778,188 B1
(45) Date of Patent: Sep. 15, 2020

(54) HARMONIC REJECTION FILTER WITH TRANSIMPEDENCE AMPLIFIERS

(71) Applicant: Qualcomm Incorporated, San Diego, CA (US)

(72) Inventor: Rahul Karmaker, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/283,689

(22) Filed: Feb. 22, 2019

(51) Int. Cl.
  *H03D 7/16* (2006.01)
  *H03H 11/12* (2006.01)
  *H03D 7/00* (2006.01)
  *H03F 3/45* (2006.01)

(52) U.S. Cl.
  CPC ........... *H03H 11/1217* (2013.01); *H03D 7/00* (2013.01); *H03F 3/45475* (2013.01); *H03F 2200/129* (2013.01); *H03F 2203/45116* (2013.01); *H03F 2203/45528* (2013.01)

(58) Field of Classification Search
  CPC . A61B 5/02416; A61B 5/681; A61B 5/14532; A61B 5/0002; A61B 5/0205; H03D 7/165; H03D 7/1441; H03D 7/1458
  See application file for complete search history.

(56) References Cited

U.S. PATENT DOCUMENTS

| | | |
|---|---|---|
| 2009/0143031 A1 | 6/2009 | Shah |
| 2010/0253412 A1 | 10/2010 | Brekelmans et al. |
| 2011/0222633 A1 | 9/2011 | Pullela et al. |
| 2018/0048339 A1* | 2/2018 | Wu .......... H04B 1/109 |
| 2019/0207288 A1* | 7/2019 | Zhu .......... H01P 5/18 |

FOREIGN PATENT DOCUMENTS

WO  WO-2006063358 A1  6/2006

OTHER PUBLICATIONS

International Search Report and Written Opinion—PCT/US2020/018974—ISA/EPO—dated May 8, 2020.

\* cited by examiner

*Primary Examiner* — Sibin Chen
(74) *Attorney, Agent, or Firm* — Qualcomm Incorporated (57) ABSTRACT

An apparatus is disclosed for a harmonic rejection filter with transimpedance amplifiers. In an example aspect, the apparatus includes a harmonic rejection filter with at least three input nodes, at least one output node, a first transimpedance amplifier, a first set of transimpedance amplifiers, and a scaling current converter. The at least three input nodes include a first input node, a second input node, and a third input node. The at least one output node includes a first output node. The first transimpedance amplifier is coupled between the first input node and the first output node. The first set of transimpedance amplifiers include a second transimpedance amplifier coupled to the second input node and a third transimpedance amplifier coupled to the third input node. The scaling current converter is coupled between outputs associated with the first set of transimpedance amplifiers and an input of the first transimpedance amplifier.

21 Claims, 7 Drawing Sheets

```
┌─────────────────────────────────────────┐
│ Accept at least three phase-shifted     │
│ downconverted signals having different  │
│ phases, the at least three phase-shifted│
│ downconverted signals including a       │
│ harmonic frequency                      │
│ 702                                     │
└─────────────────────────────────────────┘
                    ↓
┌─────────────────────────────────────────┐
│ Generate at least two scaled signals    │
│ based on at least two phase-shifted     │
│ downconverted signals of the at least   │
│ three phase-shifted downconverted       │
│ signals                                 │
│ 704                                     │
└─────────────────────────────────────────┘
                    ↓
┌─────────────────────────────────────────┐
│ Attenuate the harmonic frequency within │
│ another phase-shifted downconverted     │
│ signal of the at least three phase-     │
│ shifted downconverted signals by        │
│ combining the at least two scaled       │
│ signals and the other phase-shifted     │
│ downconverted signal together           │
│ 706                                     │
└─────────────────────────────────────────┘
                    ↓
┌─────────────────────────────────────────┐
│ Generate an output signal based on a    │
│ combination of the at least two scaled  │
│ signals and the other phase-shifted     │
│ downconverted signal                    │
│ 708                                     │
└─────────────────────────────────────────┘
```

FIG. 7

HARMONIC REJECTION FILTER WITH TRANSIMPEDENCE AMPLIFIERS

TECHNICAL FIELD

This disclosure relates generally to wireless transceivers and, more specifically, to a mixer with a harmonic rejection filter that uses transimpedance amplifiers to attenuate one or more harmonic frequencies.

BACKGROUND

Electronic devices use radio-frequency (RF) signals to communicate information. These radio-frequency signals enable users to talk with friends, upload or download information, share pictures, remotely control household devices, receive global positioning information, and so forth. Some electronic devices may include multiple transceivers, which are designed to process communication signals associated with different frequency bands to support different types of wireless communications (e.g., Bluetooth™, Wi-Fi™, or cellular) or support carrier aggregation (e.g., non-contiguous carrier aggregation (NCCA)).

Sometimes a harmonic signal is generated during operation of a first transceiver. If this harmonic signal is within a frequency band of a second transceiver that is concurrently operating, the harmonic signal can desensitize the second transceiver and generate interference. Consequently, it can be challenging for the second transceiver to receive a wireless communication signal while the harmonic signal is present.

SUMMARY

An apparatus is disclosed that implements a harmonic rejection filter with transimpedance amplifiers. The harmonic rejection filter includes a first set of transimpedance amplifiers, a second set of transimpedance amplifiers, and a scaling current converter that is coupled between the first set of transimpedance amplifiers and the second set of transimpedance amplifiers. Together, the first set of transimpedance amplifiers and the scaling current converter adjust amplitudes of multiple phase-shifted signals. At an input of the second set of transimpedance amplifiers, another phase-shifted signal is combined with the amplitude-adjusted phase-shifted signals to attenuate one or more harmonic frequencies that are present within the other phase-shifted signal, such as a third-order harmonic frequency or a fifth-order harmonic frequency.

The harmonic rejection filter can be integrated within a mixer, which includes an input node, a multi-phase mixer circuit, and at least one output node. In particular, the harmonic rejection filter is coupled between the multi-phase mixer circuit and the at least one output node. In this manner, the harmonic rejection filter is implemented within a low-frequency stage of the mixer (e.g., after at least one down-conversion step from a higher frequency stage, such as a radio-frequency stage). The multi-phase mixer circuit generates multiple phase-shifted downconverted signals, which can have relatively similar amplitudes. The harmonic rejection filter uses the multiple phase-shifted downconverted signals to attenuate a harmonic frequency within at least one of the multiple phase-shifted downconverted signals. By using the harmonic rejection filter, the mixer does not require complex routing or a scaling circuit within a high-frequency stage, or active programmable-gain amplifiers within the low-frequency stage, either of which can degrade signal-to-noise ratio performance of the mixer. In this way, the harmonic rejection filter enables the mixer to achieve a target signal-to-noise ratio and a target harmonic rejection performance. Furthermore, by attenuating the one or more harmonic frequencies, other transceivers can operate concurrently with the mixer at frequencies corresponding to the harmonic frequency without becoming desensitized.

In an example aspect, an apparatus is disclosed. The apparatus includes a harmonic rejection filter with at least three input nodes, at least one output node, a first transimpedance amplifier, a first set of transimpedance amplifiers, and a scaling current converter. The at least three input nodes include a first input node, a second input node, and a third input node. The at least one output node includes a first output node. The first transimpedance amplifier is coupled between the first input node and the first output node. The first set of transimpedance amplifiers include a second transimpedance amplifier coupled to the second input node and a third transimpedance amplifier coupled to the third input node. The scaling current converter is coupled between outputs associated with the first set of transimpedance amplifiers and an input of the first transimpedance amplifier.

In an example aspect, an apparatus is disclosed. The apparatus includes a multi-phase local oscillator configured to generate at least three phase-shifted local oscillator signals. The apparatus also includes a mixer with at least one input node, at least one output node, and a multi-phase mixer circuit. The at least one input node is configured to accept a high-frequency signal. The multi-phase mixer circuit is coupled to the at least one input node and the multi-phase local oscillator, and is configured to generate at least three phase-shifted downconverted signals based on the at least three phase-shifted local oscillator signals and the high-frequency signal. The at least three phase-shifted downconverted signals comprise a first phase-shifted downconverted signal and a set of phase-shifted downconverted signals. The at least three phase-shifted downconverted signals include at least one harmonic frequency. The mixer also includes rejection means for attenuating the at least one harmonic frequency within the first phase-shifted downconverted signal by adjusting respective amplitudes associated with the set of phase-shifted downconverted signals to generate scaled signals and by combining the scaled signals with the first phase-shifted downconverted signal to generate a low-frequency signal. The rejection means is coupled between the multi-phase mixer circuit and the at least one output node.

In an example aspect, a method for operating a harmonic rejection filter with transimpedance amplifiers is disclosed. The method includes accepting at least three phase-shifted downconverted signals, which have different phases and include a harmonic frequency. The method also includes generating at least two scaled signals based on at least two phase-shifted downconverted signals of the at least three phase-shifted downconverted signals. The method additionally includes attenuating the harmonic frequency within another phase-shifted downconverted signal of the at least three phase-shifted downconverted signals by combining the at least two scaled signals and the other phase-shifted downconverted signal together. The method further includes generating an output signal based on a combination of the at least two scaled signals and the other phase-shifted downconverted signal.

In an example aspect, an apparatus is disclosed. The apparatus includes a mixer with at least one input node, at least one output node, a multi-phase mixer circuit, and a harmonic rejection filter. The multi-phase mixer circuit is coupled to the at least one input node and includes a first set of mixer components and a second set of mixer components. The harmonic rejection filter is coupled between the multi-phase mixer circuit and the at least one output node, and includes a first set of transimpedance amplifiers, a second set of transimpedance amplifiers, and a scaling current converter. The first set of transimpedance amplifiers is coupled to the first set of mixer components and includes at least two transimpedance amplifiers. The second set of transimpedance amplifiers is coupled between the second set of mixer components and the at least one output node. The second set of transimpedance amplifiers includes at least one transimpedance amplifier. The scaling current converter is coupled between outputs associated with the first set of transimpedance amplifiers and at least one input associated with the second set of transimpedance amplifiers.

DETAILED DESCRIPTION

Some electronic devices may include multiple transceivers, which are designed to process wireless communication signals associated with different frequency bands. Sometimes a harmonic signal is generated during operation of a first transceiver. If this harmonic signal is within a frequency band of a second transceiver that is concurrently operating, the harmonic signal can desensitize the second transceiver and generate interference. Consequently, it can be challenging for the second transceiver to receive a wireless communication signal while the harmonic signal is present.

Some techniques split a low-noise amplifier into multiple amplifiers or integrate a scaling circuit within a high-frequency stage of a mixer (e.g., a stage that occurs prior to a downconversion operation within the mixer). The multiple amplifiers or the scaling circuit adjust an amplitude of the received radio-frequency signal by different amounts to generate multiple radio-frequency signals. The mixer downconverts these multiple radio-frequency signals to generate multiple downconverted signals and combines these multiple downconverted signals in a way that attenuates a harmonic frequency. This technique, however, increases a complexity of high-frequency routings to the mixer and high-frequency routings within the high-frequency stage of the mixer. Furthermore, due to a proximity of these routings, isolation performance can degrade, which decreases a signal-to-noise ratio performance and a noise figure of the transceiver.

Other techniques use active programmable-gain amplifiers to adjust amplitudes of downconverted signals within a low-frequency stage of a mixer (e.g., a stage that occurs after a downconversion operation within the mixer). These amplitude-adjusted downconverted signals are combined in a way to attenuate a harmonic frequency. However, the use of active components increases power consumption of the mixer and degrades signal-to-noise ratio performance of the transceiver. Consequently, it can be challenging to realize harmonic rejection without adversely impacting other performance parameters.

To address such challenges, techniques for implementing a harmonic rejection filter with transimpedance amplifiers are described herein. The harmonic rejection filter includes a first set of transimpedance amplifiers, a second set of transimpedance amplifiers, and a scaling current converter that is coupled between the first set of transimpedance amplifiers and the second set of transimpedance amplifiers. Together, the first set of transimpedance amplifiers and the scaling current converter adjust amplitudes of multiple phase-shifted signals. At an input of the second set of transimpedance amplifiers, another phase-shifted signal is combined with the amplitude-adjusted phase-shifted signals to attenuate one or more harmonic frequencies that are present within the other phase-shifted signal, such as a third-order harmonic frequency or a fifth-order harmonic frequency.

The harmonic rejection filter can be integrated within a mixer, which includes an input node, a multi-phase mixer circuit, and at least one output node. In particular, the harmonic rejection filter is coupled between the multi-phase mixer circuit and the at least one output node. In this manner, the harmonic rejection filter is implemented within a low-frequency stage of the mixer (e.g., after at least one downconversion step from a higher frequency stage, such as a radio-frequency stage). The multi-phase mixer circuit generates multiple phase-shifted downconverted signals, which can have relatively similar amplitudes. The harmonic rejection filter uses the multiple phase-shifted downconverted signals to attenuate a harmonic frequency within at least one of the multiple phase-shifted downconverted signals. By using the harmonic rejection filter, the mixer does not require complex routing or a scaling circuit within a high-frequency stage, or active programmable-gain amplifiers within the low-frequency stage, either of which can degrade signal-to-noise ratio performance of the mixer. In this way, the harmonic rejection filter enables the mixer to achieve a target signal-to-noise ratio and a target harmonic rejection performance. Furthermore, by attenuating the one or more harmonic frequencies, other transceivers can operate concurrently with the mixer at frequencies corresponding to the harmonic frequency without becoming desensitized.

Figure 1:
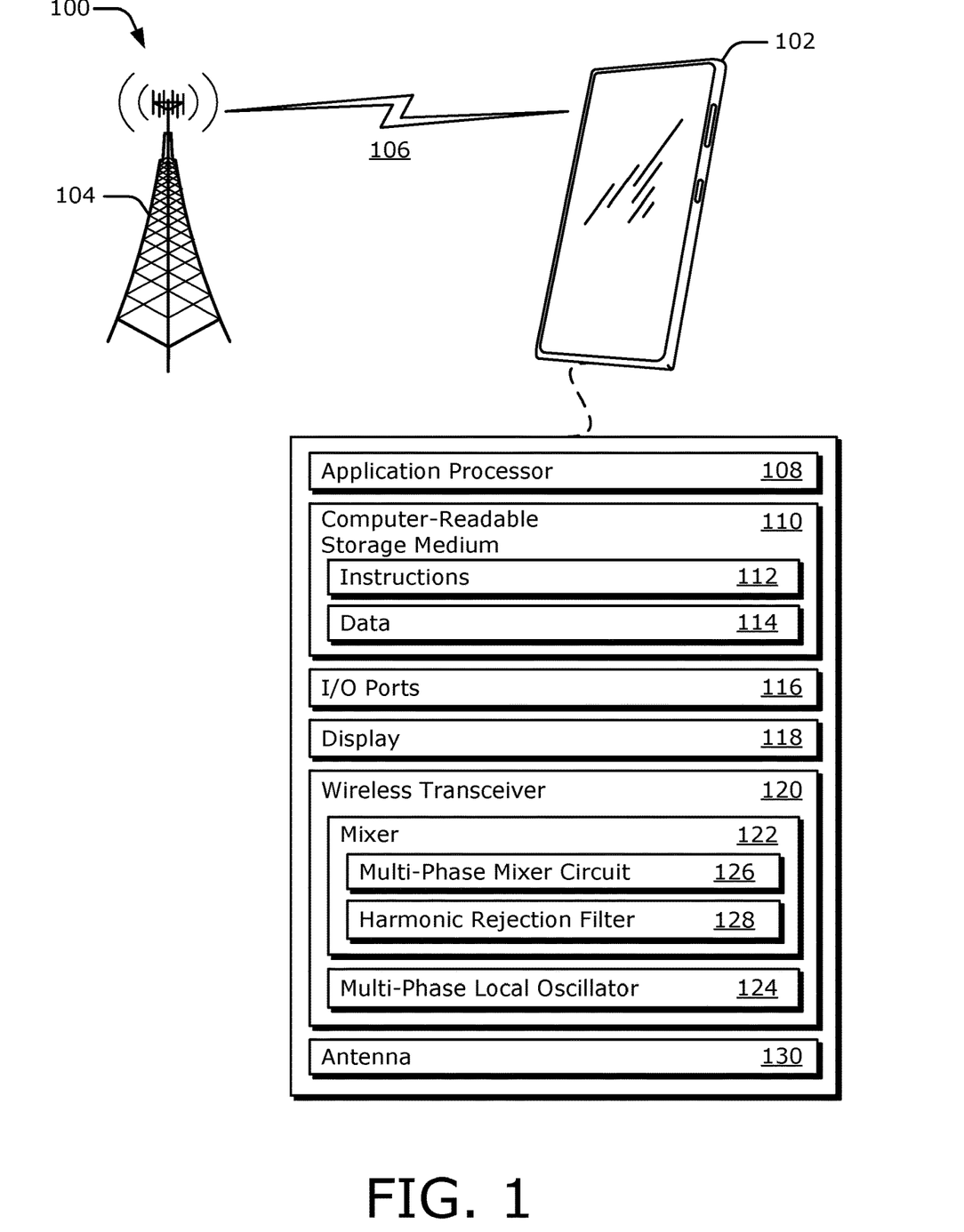
FIG. 1 illustrates an example operating environment for a harmonic rejection filter with transimpedance amplifiers.

FIG. 1 illustrates an example environment 100 for a harmonic rejection filter with transimpedance amplifiers. In the environment 100, a computing device 102 communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, and so forth. Therefore, the computing device 102 may communicate with the base station 104 or another device via the wireless link 106.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as second-generation (2G), third-generation (3G), fourth-generation (4G), or fifth-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 wirelessly provides power and the base station 104 comprises a power source.

As shown, the computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (LAN) (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 130. Components of the wireless transceiver 120 can include amplifiers, switches, mixers, analog-to-digital converters, filters, and so forth for conditioning the communication signals (e.g., for generating or processing signals). The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receive chains). In general, the wireless transceiver 120 processes data and/or signals associated with communicating data of the computing device 102 over the antenna 130.

In the depicted configuration, the wireless transceiver 120 includes a mixer 122 and a multi-phase local oscillator 124. The mixer 122 downconverts a received signal from a high frequency (e.g., a radio-frequency or an intermediate frequency) to a low frequency (e.g., an intermediate frequency or a baseband frequency). If the wireless transceiver 120 is a direct-conversion transceiver, the wireless transceiver 120 includes a single mixer 122 that downconverts a received signal from a radio frequency to a baseband frequency in a single stage. Alternatively, if the wireless transceiver 120 is a superheterodyne transceiver, the wireless transceiver 120 includes multiple mixers 122 that downconvert a received signal from a radio frequency to a baseband frequency in multiple stages. The mixer 122 is coupled to the multi-phase local oscillator 124.

The multi-phase local oscillator 124 generates at least three phase-shifted local oscillator signals, which have different phases and include a local oscillator frequency. As an example, the multi-phase local oscillator 124 operates with a 12.5% duty cycle to output eight phase-shifted local oscillator signals that differ in phase by 45 degrees, as further described with respect to FIG. 5. Other types of multi-phase local oscillators 124 that operate with different duty cycles and output other quantities of phase-shifted local oscillator signals can alternatively be used.

The mixer 122 includes a multi-phase mixer circuit 126 and a harmonic rejection filter (HRF) 128. The multi-phase mixer circuit 126 is coupled to the multi-phase local oscillator 124 and downconverts the received signal using the phase-shifted local oscillator signals. The multi-phase mixer circuit 126 includes at least three mixer components, which respectively generate at least three phase-shifted downconverted signals. The mixer components can be single-balanced mixers or double-balanced mixers, for instance.

Sometimes these phase-shifted downconverted signals, which are produced by the multi-phase mixer circuit 126, include one or more harmonic frequencies. The one or more harmonic frequencies can be associated with the local oscillator frequency or a frequency of the received signal. As an example, a harmonic frequency can be an odd-order harmonic frequency (e.g., a third-order harmonic frequency or a fifth-order harmonic frequency) of an associated frequency. To support concurrent operation of multiple receiver chains within the wireless transceiver 120, the harmonic rejection filter 128 attenuates the one or more harmonic frequencies.

Figure 4:
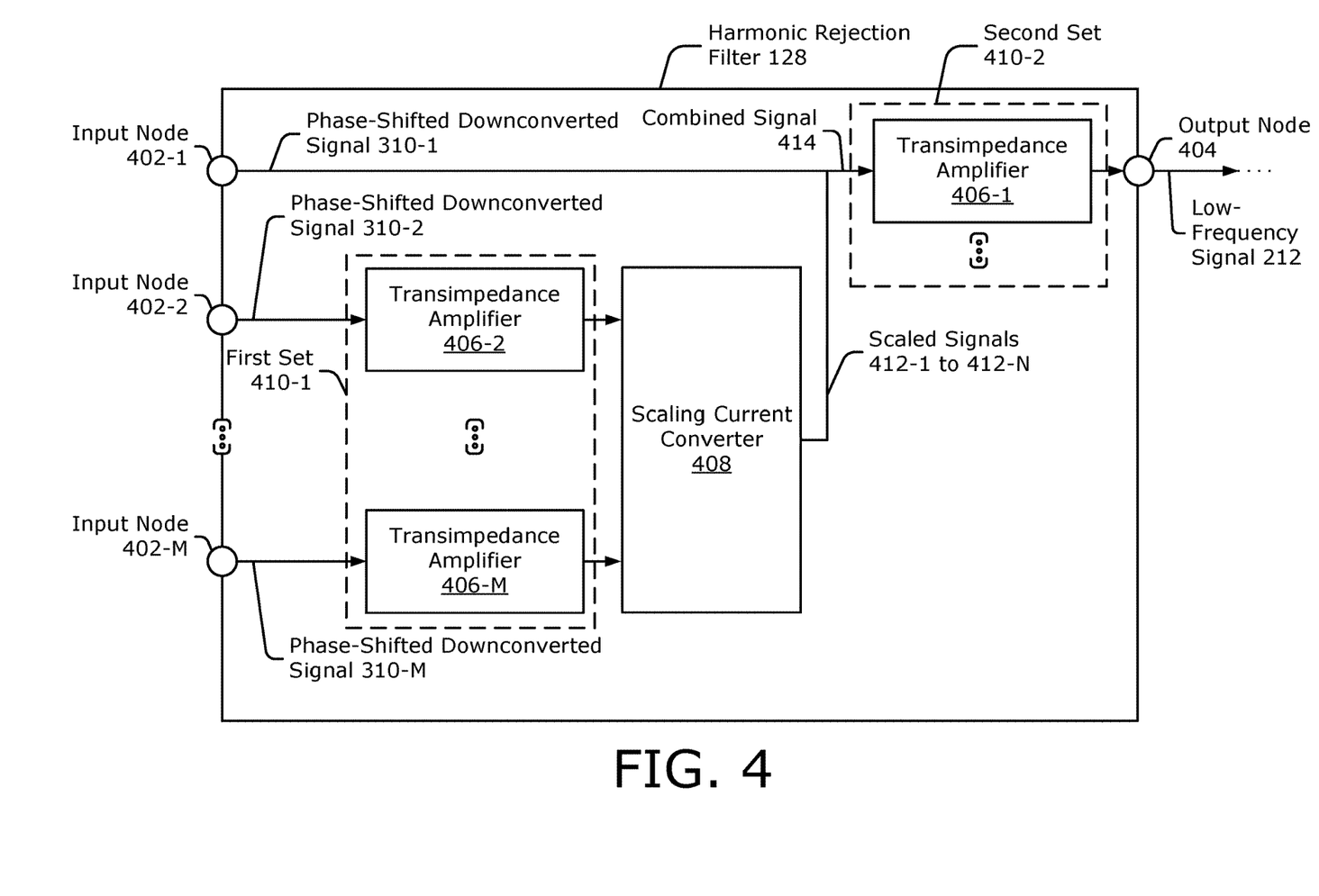
FIG. 4 illustrates an example implementation of a harmonic rejection filter with transimpedance amplifiers.

The harmonic rejection filter 128 includes at least three transimpedance amplifiers, as further described with respect to FIG. 4. Using the transimpedance amplifiers, the harmonic rejection filter 128 accepts the phase-shifted downconverted signals from the multi-phase mixer circuit 126 and attenuates one or more harmonic frequencies that are present within at least one of the phase-shifted downconverted signals. In particular, the harmonic rejection filter 128 adjusts amplitudes associated with a set of the phase-shifted downconverted signals to generate scaled signals. The harmonic rejection filter 128 generates an output signal based on a combination of the scaled signals and at least one of the phase-shifted downconverted signals (e.g., an unscaled phase-shifted downconverted signal). By combining the scaled signals and this unscaled phase-shifted downconverted signal together, the harmonic frequency within the output signal is attenuated relative to the harmonic frequency present within the unscaled phase-shifted downconverted signal. With the harmonic rejection filter 128, the mixer 122 can implement a harmonic rejection mixer (HRM). The wireless transceiver 120 is further described with respect to FIG. 2.

Figure 2:
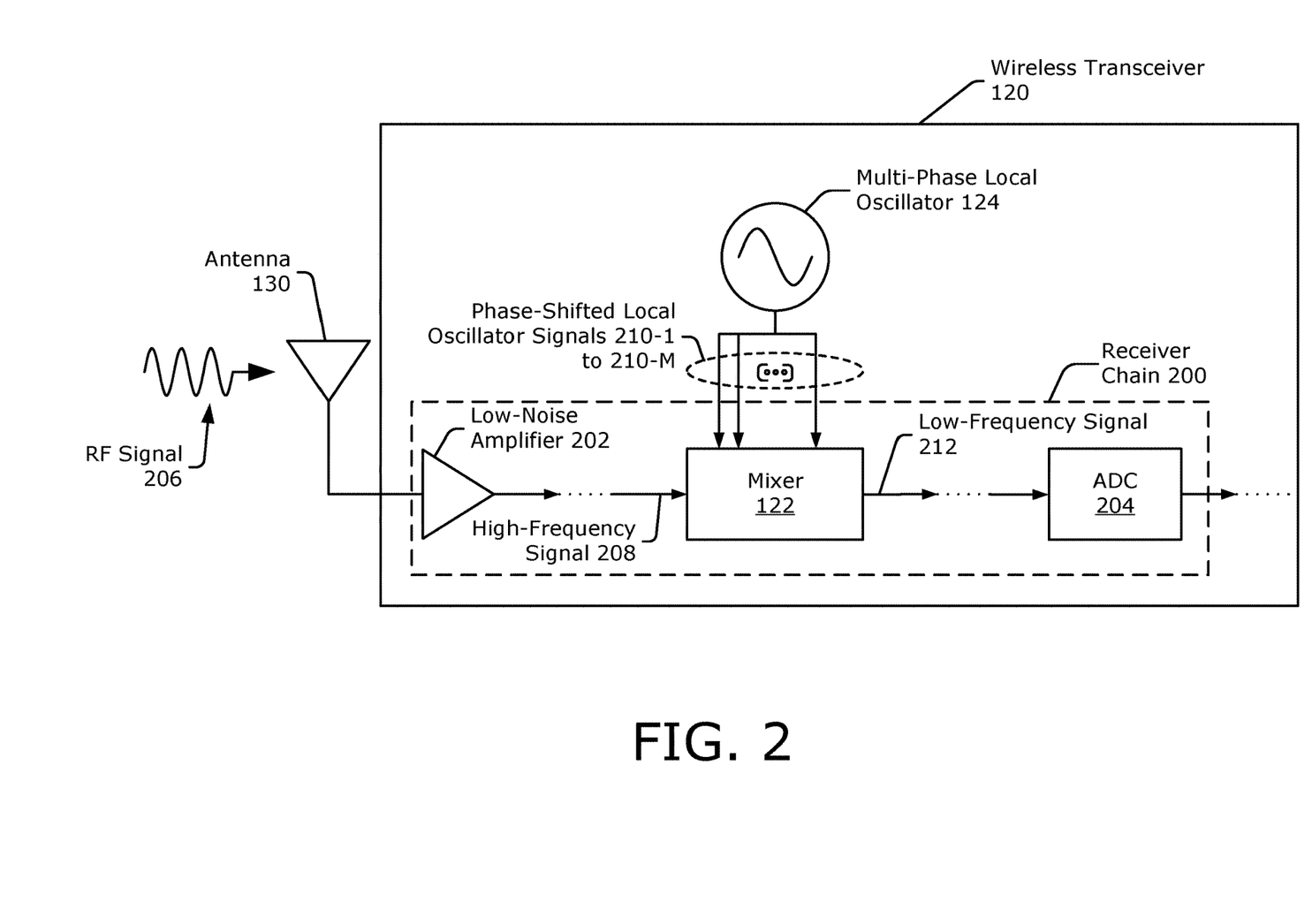
FIG. 2 illustrates an example receiver chain of a wireless transceiver including a mixer that can employ a harmonic rejection filter.

FIG. 2 illustrates an example receiver chain 200 of the wireless transceiver 120 including a mixer that can employ the harmonic rejection filter 128. In the depicted configuration, the receiver chain 200 includes a low-noise amplifier (LNA) 202 and an analog-to-digital converter (ADC) 204 along with the mixer 122 and the multi-phase local oscillator 124 of FIG. 1. Within the receiver chain 200, the mixer 122 is coupled between the low-noise amplifier 202 and the analog-to-digital converter 204. In some cases, other components are coupled between the mixer 122 and either the low-noise amplifier 202 or the analog-to-digital converter 204. These other components can include a phase shifter, another mixer, or a variable gain amplifier, for instance.

During operation, the antenna 130 receives a radio-frequency signal 206 and passes the radio-frequency signal 206 to the low-noise amplifier 202. The low-noise amplifier 202 amplifies the radio-frequency signal 206 and passes the radio-frequency signal 206 to other components within the receiver chain 200. The receiver chain 200 provides a high-frequency signal 208 to the mixer 122. The high-frequency signal 208 can be the radio-frequency signal 206 or an intermediate-frequency signal (not shown). The multi-phase local oscillator 124 generates at least three phase-shifted local oscillator signals 210-1 to 210-M, with M representing a positive integer greater than two.

Using the phase-shifted local oscillator signals 210-1 to 210-M, the mixer 122 downconverts the high-frequency signal 208 and generates at least one low-frequency signal 212. The low-frequency signal 212 can be an intermediate-frequency signal or a baseband signal. Thus, the low-frequency signal 212 includes a lower frequency relative to a higher frequency of the high-frequency signal 208. In some cases, the mixer 122 generates multiple low-frequency signals 212, such as a low-frequency in-phase signal and a low-frequency quadrature signal, as further described with respect to FIG. 6. The receiver chain 200 passes the low-frequency signal 212 to other components, such as the analog-to-digital converter 204, which digitizes the low-frequency signal 212 to enable information contained within the low-frequency signal 212 to be processed.

In some situations, the wireless transceiver 120 includes other receiver chains (not shown), which operate concurrently with the receiver chain 200. If the mixer 122 does not sufficiently attenuate harmonic frequencies that are present within the receiver chain 200, these harmonic frequencies can interfere with operation of the other receiver chains and reduce sensitivity of these other receiver chains. With the harmonic rejection filter 128 (e.g., of FIGS. 1 and 3), however, the mixer 122 can achieve a target harmonic rejection performance to support concurrent operations or techniques such as carrier aggregation. The mixer 122 is further described with respect to FIG. 3.

Figure 3:
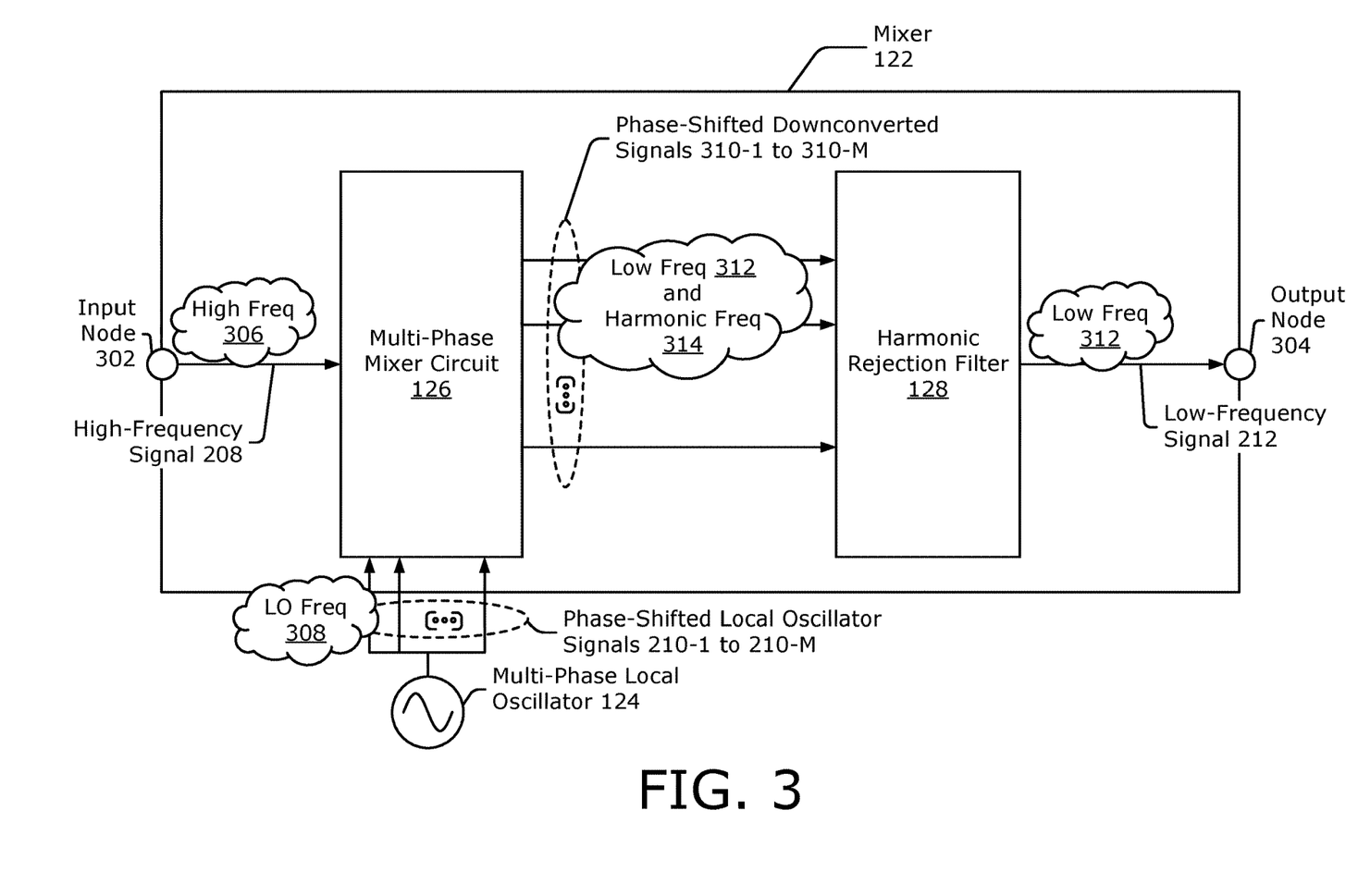
FIG. 3 illustrates an example implementation of a mixer with a harmonic rejection filter and a multi-phase mixer circuit.

FIG. 3 illustrates an example implementation of the mixer 122 with the harmonic rejection filter 128 and the multi-phase mixer circuit 126. The mixer 122 includes at least one input node 302 and at least one output node 304. The multi-phase mixer circuit 126 is coupled to the input node 302 and the multi-phase local oscillator 124. The harmonic rejection filter 128 is coupled between the multi-phase mixer circuit 126 and the output node 304.

During operation, the multi-phase mixer circuit 126 accepts the high-frequency signal 208 from the input node 302 and accepts the phase-shifted local oscillator signals 210-1 to 210-M from the multi-phase local oscillator 124. The high-frequency signal 208 includes a high frequency 306 (e.g., a radio frequency or an intermediate frequency) and the multiple phase-shifted local oscillator signals 210-1 to 210-M include a local-oscillator (LO) frequency 308. The multi-phase mixer circuit 126 downconverts the high-frequency signal 208 using the multiple phase-shifted local oscillator signals 210-1 to 210-M and generates at least three phase-shifted downconverted signals 310-1 to 310-M.

The phase-shifted downconverted signals 310-1 to 310-M have different phases, which are based on phases of the phase-shifted local oscillator signals 210-1 to 210-M and a phase of the high-frequency signal 208. In some cases, the phase-shifted downconverted signals 310-1 to 310-M have relatively similar amplitudes. As such, the multi-phase mixer circuit 126 does not necessarily include components, such as resistors or amplifiers, that cause an amplitude of a first phase-shifted downconverted signal 310-1 to differ from an amplitude of a second phase-shifted downconverted signal 310-M.

Additionally, the phase-shifted downconverted signals 310-1 to 310-M include a low frequency 312 (e.g., an intermediate frequency or a baseband frequency) and a harmonic frequency 314. The low frequency 312 is based on a combination of the high frequency 306 and the local oscillator frequency 308. As an example, the low frequency 312 is approximately equal to a difference between the high frequency 306 and the local oscillator frequency 308. The harmonic frequency 314, however, represents a harmonic of the local oscillator frequency 308 or the high frequency 306, such as an odd-order harmonic. Generally, the harmonic frequency 314 is higher than the low frequency 312.

The harmonic rejection filter 128 generates at least one low-frequency signal 212 based on the phase-shifted downconverted signals 310-1 to 310-M. In particular, the harmonic rejection filter 128 adjusts amplitudes associated with a set of the phase-shifted downconverted signals 310-1 to 310-M to generate scaled signals. The harmonic rejection filter 128 combines these scaled signals with another phase-shifted downconverted signal 310-1 to 310-M to attenuate the harmonic frequency 314 within the other phase-shifted downconverted signal 310-1 to 310-M. This combination results in the low-frequency signal 212, which includes the low frequency 312 with an amplitude that is greater than an amplitude of the harmonic frequency 314. In some cases, the harmonic rejection filter 128 enables the mixer 122 to achieve a harmonic rejection performance of at least 60 decibels relative to a carrier (dBc). The harmonic rejection filter 128 passes the low-frequency signal 212 to the output node 304. The harmonic rejection filter 128 is further described with respect to FIG. 4.

FIG. 4 illustrates an example implementation of the harmonic rejection filter 128 with transimpedance amplifiers. In the depicted configuration, the harmonic rejection filter 128 includes at least three input nodes 402-1 to 402-M, at least one output node 404, at least three transimpedance amplifiers 406-1 to 406-M, and at least one scaling current converter 408. Generally, the transimpedance amplifiers 406-1 to 406-M represent current-to-voltage converters. A first set of the transimpedance amplifiers 406-1 to 406-M (first set 410-1) is coupled between the corresponding input nodes 402-1 to 402-M and the scaling current converter 408. A second set of the transimpedance amplifiers 406-1 to 406-M (second set 410-2) is coupled to the one or more output nodes 404. The scaling current converter 408 is coupled between outputs of the transimpedance amplifiers 406-1 to 406-M within the first set 410-1 and inputs of the transimpedance amplifiers 406-1 to 406-M within the second set 410-2. In this example, the first set 410-1 includes the transimpedance amplifiers 406-2 and 406-M, and the second set 410-2 includes the transimpedance amplifier 406-1. Other implementations can include more than two transimpedance amplifiers within the first set 410-1 or more than one transimpedance amplifier within the second set 410-2. With additional transimpedance amplifiers within the first set 410-1, the harmonic rejection filter 128 can attenuate higher-order harmonic frequencies (e.g., a seventh-order harmonic).

During operation, the harmonic rejection filter 128 accepts the phase-shifted downconverted signals 310-1 to 310-M at the respective input nodes 402-1 to 402-M. In this case, the phase-shifted downconverted signals 310-1 to 310-M are represented by currents. The transimpedance amplifiers 406-2 and 406-M within the first set 410-1 generate respective voltages based on these currents. Using these respective voltages, the scaling current converter 408 generates scaled currents that are represented as scaled signals 412-1 to 412-N, with N representing a positive integer less than M. Together, the first set 410-1 of transimpedance amplifiers and the scaling current converter 408 generate the scaled signals 412-1 to 412-N to have different amplitudes relative to the corresponding phase-shifted downconverted signals 310-2 and 310-M, which enable the harmonic frequency 314 to be attenuated at the output node 404.

To perform the attenuation, the harmonic rejection filter 128 combines a current associated with the phase-shifted downconverted signal 310-1 and the scaled currents associated with the scaled signals 412-1 to 412-N at an input of the transimpedance amplifier 406-1 to produce a combined signal 414. Due to the scaled signals 412-1 to 412-N, the harmonic frequency 314 that is present within the combined signal 414 is attenuated with respect to the phase-shifted downconverted signal 310-1. The transimpedance amplifier 406-1 generates a voltage based on the combined signal 414. This voltage corresponds to the low-frequency signal 212. The output node 404 passes the resulting low-frequency signal 212 to the output node 304 of the mixer 122 (of FIG. 3).

With reference to FIGS. 3 and 4, consider an example in which the mixer 122 generates the low-frequency signal 212 as a low-frequency in-phase signal with a phase that is relatively similar to a phase of the high-frequency signal 208. Additionally, the harmonic rejection filter 128 attenuates a third-order harmonic frequency 314 associated with the local oscillator frequency 308. In this case, the multi-phase mixer circuit 126 generates three phase-shifted downconverted signals 310-1, 310-2, and 310-M, which have respective phase offsets of 0 degrees, 45 degrees, and 315 degrees relative to the high-frequency signal 208. To attenuate the harmonic frequency 314, the harmonic rejection filter 128 causes the combined signal 414 to be approximately equal to the following as shown in Equation 1:

$$\text{Combined Signal} = SIG0 + \frac{1}{\sqrt{2}} SIG45 + \frac{1}{\sqrt{2}}(-SIG135) \quad \text{Equation 1}$$
$$= SIG0 + \frac{1}{\sqrt{2}} SIG45 + \frac{1}{\sqrt{2}}(SIG135)$$

where combined signal represents the combined signal 414, SIG0 represents the phase-shifted downconverted signal 310-1, SIG45 represents the phase-shifted downconverted signal 310-2, and SIG315 represents the phase-shifted downconverted signal 310-M. Within the phase-shifted downconverted signals 310-2 and 310-M, component signals associated with the harmonic frequency 314 and the low frequency 312 differ in phase by 90 degrees. Consequently, adding the scaled versions of the phase-shifted downconverted signals 310-2 and 310-M to the phase-shifted downconverted signal 310-1 effectively attenuates the harmonic frequency 314 within the phase-shifted downconverted signal 310-1 and amplifies the low frequency 312 within the phase-shifted downconverted signal 310-1.

Figure 6:
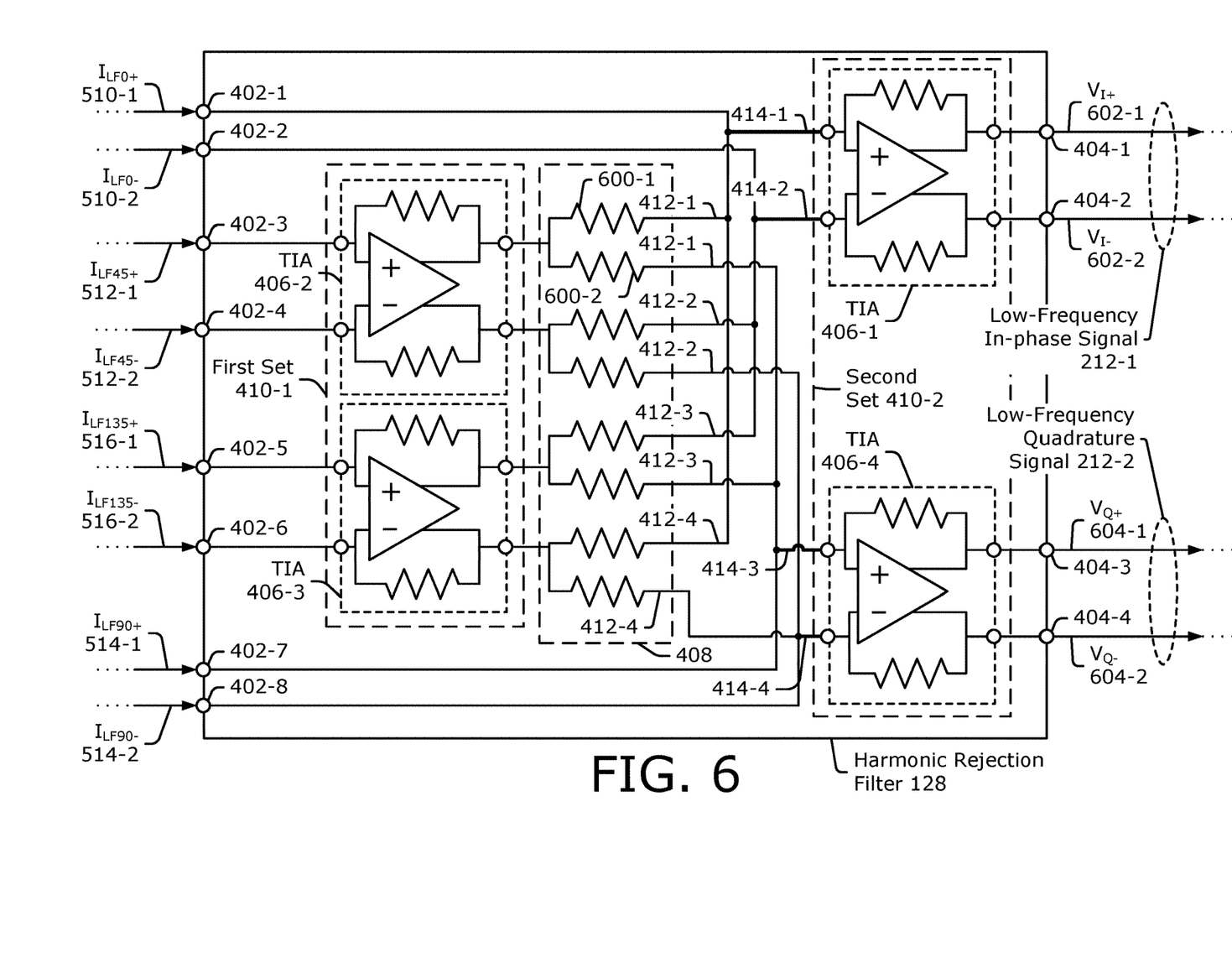
FIG. 6 illustrates an example differential implementation of a harmonic rejection filter with transimpedance amplifiers.

To achieve this desired combined signal 414 in accordance with the example of Equation 1, the transimpedance amplifier 406-2 and the scaling current converter 408 generate a first scaled signal 412-1 that is approximately equal to the phase-shifted downconverted signal 310-2 scaled by a factor of one divided by a square root of two. Likewise, the transimpedance amplifier 406-M and the scaling current converter 408 generate a second scaled signal 412-N that is approximately equal to the phase-shifted downconverted signal 310-M scaled by a factor of one divided by a square root of two, as shown in Equation 1. To achieve the appropriate scaling, the scaling current converter 408 includes a network of passive components, such as resistors, as shown in FIG. 6. By using passive components, the scaling current converter 408 can avoid using active components that can degrade a signal-to-noise ratio performance of the mixer 122.

Alternatively, the mixer 122 generates the low-frequency signal 212 as a low-frequency quadrature signal with a phase that differs from a phase of the high-frequency signal 208 by approximately 90 degrees. In this case, the multi-phase mixer circuit 126 generates three phase-shifted downconverted signals 310-1, 310-2, and 310-M, which have respective phase offsets of 90 degrees, 45 degrees, and 135 degrees relative to the high-frequency signal 208. To attenuate the third-order harmonic of the local oscillator frequency 308, the harmonic rejection filter 128 causes the combined signal 414 to be approximately equal to the following as shown in Equation 2:

$$\text{Combined Signal} = SIG90 + \frac{1}{\sqrt{2}} SIG45 + \frac{1}{\sqrt{2}} SIG135 \quad \text{Equation 2}$$

where combined signal represents the combined signal 414, SIG90 represents the phase-shifted downconverted signal 310-1, SIG45 represents the phase-shifted downconverted signal 310-2, and SIG135 represents the phase-shifted downconverted signal 310-M. As described above, component signals associated with the harmonic frequency 314 and the low frequency 312 within the phase-shifted downconverted signals 310-2 and 310-M differ in phase by 90 degrees. Consequently, adding these scaled versions of the phase-shifted downconverted signals 310-2 and 310-M to the phase-shifted downconverted signal 310-1 effectively attenuates the harmonic frequency 314 within the phase-shifted downconverted signal 310-1 and amplifies the low frequency 312 within the phase-shifted downconverted signal.

Single-ended implementations are illustrated in FIGS. 2-4 for simplicity. The techniques described above can also be applied to differential implementations, as further described with respect to FIGS. 5 and 6.

Figure 5:
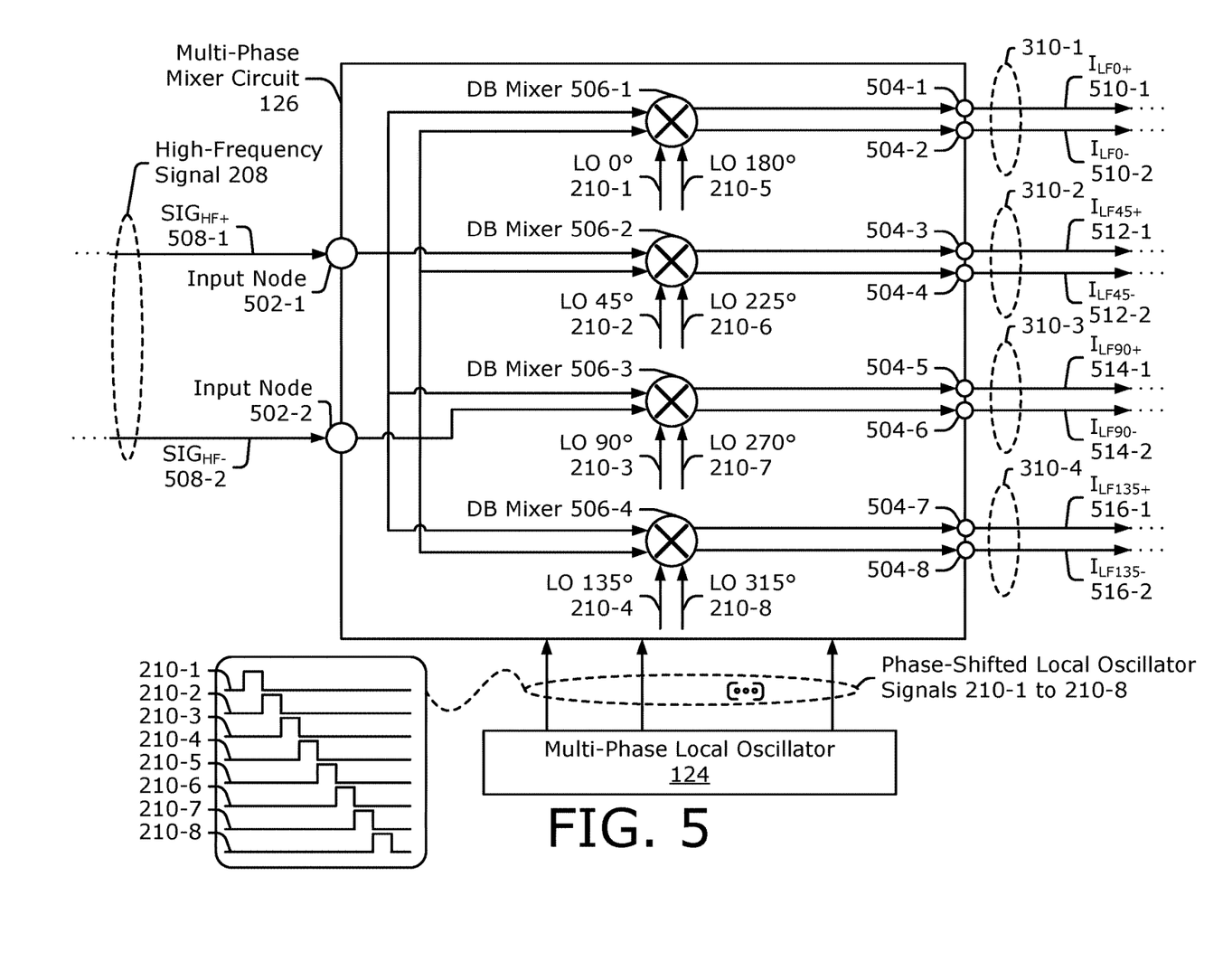
FIG. 5 illustrates an example differential implementation of a multi-phase mixer circuit.

FIG. 5 illustrates an example differential implementation of the multi-phase mixer circuit 126. In the depicted configuration, the multi-phase mixer circuit 126 includes two input nodes 502-1 and 502-2, eight output nodes 504-1 to 504-8, and four mixer components implemented as double-balanced (DB) mixers 506-1 to 506-4. The four double-balanced mixers 506-1 to 506-4 are each coupled to the input nodes 502-1 and 502-2 as well as the multi-phase local oscillator 124. The multi-phase local oscillator 124 generates eight phase-shifted local oscillator signals 210-1 to 210-8. Relative phases of the phase-shifted local oscillator signals 210-1 to 210-8 vary from 0 degrees to 315 degrees in 45 degree increments with respect to the phase of the high-frequency signal 208.

The double-balanced mixer 506-1 is coupled to the output nodes 504-1 and 504-2, and accepts the phase-shifted local oscillator signals 210-1 and 210-5, which respectively have phase offsets of 0 degrees and 180 degrees. The double-balanced mixer 506-2 is coupled to the output nodes 504-3 and 504-4, and accepts the phase-shifted local oscillator signals 210-2 and 210-6, which respectively have phase offsets of 45 degrees and 225 degrees. The double-balanced mixer 506-3 is coupled to the output nodes 504-5 and 504-6, and accepts the phase-shifted local oscillator signals 210-3 and 210-7, which respectively have phase offsets of 90 degrees and 270 degrees. The double-balanced mixer 506-4 is coupled to the output nodes 504-7 and 504-8, and accepts the phase-shifted local oscillator signals 210-4 and 210-8, which respectively have phase offsets of 135 degrees and 315 degrees.

At the input nodes 502-1 and 502-2, the multi-phase mixer circuit 126 accepts the high-frequency signal 208, which comprises differential signals $SIG_{HF+}$ 508-1 and $SIG_{HF-}$ 508-2. The double-balanced mixer 506-1 generates the phase-shifted downconverted signal 310-1 based on the differential signals $SIG_{HF+}$ 508-1 and $SIG_{HF-}$ 508-2 and the phase-shifted local oscillator signals 210-1 and 210-5. The phase-shifted downconverted signal 310-1 includes differential currents $I_{LF0+}$ 510-1 and $I_{LF0-}$ 510-2. Likewise, the double-balanced mixers 506-2, 506-3, and 506-4 respectively generate the phase-shifted downconverted signals 310-2, 320-3, and 320-4. Similar to the phase-shifted downconverted signal 310-1, the phase-shifted downconverted signal 310-2 includes differential currents $I_{LF45+}$ 512-1 and $I_{LF45-}$ 512-2, the phase-shifted downconverted signal 310-3 includes differential currents $I_{LF90+}$ 514-1 and $I_{LF90-}$ 514-2, and the phase-shifted downconverted signal 310-4 includes differential currents $I_{LF135+}$ 516-1 and $I_{LF135-}$ 516-2. The multi-phase mixer circuit 126 passes these phase-shifted downconverted signals 310-1 to 310-4 to the harmonic rejection filter 128, as further described with respect to FIG. 6.

FIG. 6 illustrates an example differential implementation of the harmonic rejection filter 128 with transimpedance amplifiers. In the depicted configuration, the harmonic rejection filter 128 includes eight input nodes 402-1 to 402-8, four output nodes 404-1 to 404-4, and four transimpedance amplifiers 406-1 to 406-4. The first set 410-1 of transimpedance amplifiers includes the transimpedance amplifiers 406-2 and 406-3. The transimpedance amplifier 406-2 is coupled to the input nodes 402-3 and 402-4, and the transimpedance amplifier 406-3 is coupled to the input nodes 402-5 and 402-6. The second set 410-2 of transimpedance amplifiers includes the transimpedance amplifiers 406-1 and 406-4. The transimpedance amplifier 406-1 is coupled between the input nodes 402-1 and 402-2 and the output nodes 404-1 and 404-2. Similarly, the transimpedance amplifier 406-4 is coupled between the input nodes 402-7 and 402-8 and the output nodes 404-3 and 404-4.

Each of the transimpedance amplifiers 406-1 to 406-4 include an operational amplifier and at least two resistors. For explanation purposes, the resistors within the transimpedance amplifiers 406-1 to 406-4 have a similar resistance represented as $R_{TIA}$. Other implementations can have different resistances or include programmable resistors.

Through the scaling current converter 408, the transimpedance amplifier 406-2 is coupled to both of the transimpedance amplifiers 406-1 and 406-4. Likewise, the transimpedance amplifier 406-3 is coupled to both of the transimpedance amplifiers 406-1 and 406-4 via the scaling current converter 408. In this example, the scaling current converter 408 includes eight resistors, with two pairs of resistors coupled between each output of the first set 410-1 of transimpedance amplifiers and different inputs of the second set 410-2 of transimpedance amplifiers. For example, the scaling current converter 408 includes a first resistor 600-1 and a second resistor 600-2, which are coupled between an output of the transimpedance amplifier 406-2 and inputs of the transimpedance amplifiers 406-1 and 406-4, respectively. By having a pair of resistors coupled to each output of the first set 410-1 of transimpedance amplifiers, individual currents can be provided to different transimpedance amplifiers within the second set 410-2 of transimpedance amplifiers. To attenuate the harmonic frequency 314, the resistors within the scaling current converter 408 have similar resistances of $\sqrt{2}\ R_{TIA}$, which enables the harmonic rejection filter 128 to achieve one or more combined signal 414 according to Equation 1 or 2.

During operation, the transimpedance amplifier 406-2 converts the currents $I_{LF45+}$ 512-1 and $I_{LF45-}$ 512-2 to voltages. These voltages are proportional to the corresponding current multiplied by the resistance of the corresponding resistor within the transimpedance amplifier 406-2 (e.g., $V_{LF45+}=R_{TIA}\cdot I_{LF45+}$ and $V_{LF45-}=R_{TIA}\cdot I_{LF45-}$). Using these voltages, the scaling current converter 408 generates scaled currents represented by the scaled signals 412-1 and 412-2, which have respective amplitudes of $$\frac{1}{\sqrt{2}} I_{LF45+} \text{ and } \frac{1}{\sqrt{2}} I_{LF45-}.$$

Similarly, the transimpedance amplifier 406-3 converts the currents $I_{LF135+}$ 516-1 and $I_{LF135-}$ 516-2 to voltages based on the resistance $R_{TIA}$ (e.g., $V_{LF135+}=R_{TIA}\cdot I_{LF135+}$ and $V_{LF135-}\ R_{TIA}\cdot I_{LF135-}$). Using these voltages, the scaling current converter 408 generates scaled currents represented by the scaled signals 412-3 and 412-4, which have respective amplitudes of $$\frac{1}{\sqrt{2}} I_{LF135+} \text{ and } \frac{1}{\sqrt{2}} I_{LF135-}.$$

With the scaled signals 412-1 to 412-4, the harmonic rejection filter 128 attenuates harmonic frequencies 314 within the currents $I_{LF0+}$ 510-1, $I_{LF0-}$ 510-2, $I_{LF90+}$ 514-1, and $I_{LF90-}$ 514-2 according to Equations 1 and 2 above.

For example, the harmonic rejection filter 128 combines the scaled signal 412-1, the scaled current 412-4, and the current $I_{LF0+}$ 510-1 at a first input of the transimpedance amplifier 406-1. The resulting combined signal 414-1 is approximately equal to a summation of $I_{LF0+}$ 510-1, $$\frac{1}{\sqrt{2}} I_{LF45+}, \text{ and } \frac{1}{\sqrt{2}} I_{LF135-},$$

which attenuates a harmonic frequency 314 according to Equation 1. The harmonic rejection filter 128 also combines the scaled signal 412-2, the scaled signal 412-3, and the current $I_{LF0-}$ 510-2 at a second input of the transimpedance amplifier 406-1 such that the resulting combined signal 414-2 is approximately equal to a summation of $I_{LF0-}$ 510-2, $$\frac{1}{\sqrt{2}} I_{LF45-}, \text{ and } \frac{1}{\sqrt{2}} I_{LF135+}.$$

Within the combined signal 414-2, the harmonic frequency 314 is also attenuated, similar to the combined signal 414-1. The transimpedance amplifier 406-1 generates voltages $V_{I+}$ 602-1 and $VI-$ 602-2 based on the combined signals 414-1 and 414-2, respectively. These voltages $V_{I+}$ 602-1 and $V_{I-}$ 602-2 represent a low-frequency in-phase signal 212-1, which is provided to output nodes of the mixer 122 (of FIG. 3).

To generate a low-frequency quadrature signal 212-2, the harmonic rejection filter 128 combines the scaled signal 412-1, the scaled signal 412-3, and the current $I_{LF90+}$ 514-1 at a first input of the transimpedance amplifier 406-4. The resulting combined signal 414-3 is approximately equal to a summation of $I_{LF90+}$ 514-1, $$\frac{1}{\sqrt{2}} I_{LF45+}, \text{ and } \frac{1}{\sqrt{2}} I_{LF135+},$$

which attenuates a harmonic frequency 314 according to Equation 2. The harmonic rejection filter 128 also combines the scaled signal 412-2, the scaled signal 412-4, and the current $I_{LF90-}$ 514-2 at a second input of the transimpedance amplifier 406-4 such that the resulting combined signal 414-4 is approximately equal to a summation of $I_{LF90-}$ 514-2, $$\frac{1}{\sqrt{2}} I_{LF45-}, \text{ and } \frac{1}{\sqrt{2}} I_{LF135-}.$$

Within the combined signal 414-4, the harmonic frequency 314 is also attenuated, similar to the combined signal 414-3. The transimpedance amplifier 406-4 generates voltages $V_{Q+}$ 604-1 and $V_{Q-}$ 604-2 based on the combined signals 414-3 and 414-4, respectively. These voltages $V_{Q+}$ 604-1 and $V_{Q-}$ 604-2 represent the low-frequency quadrature signal 212-2, which is provided to other output nodes of the mixer 122.

Figure 7:
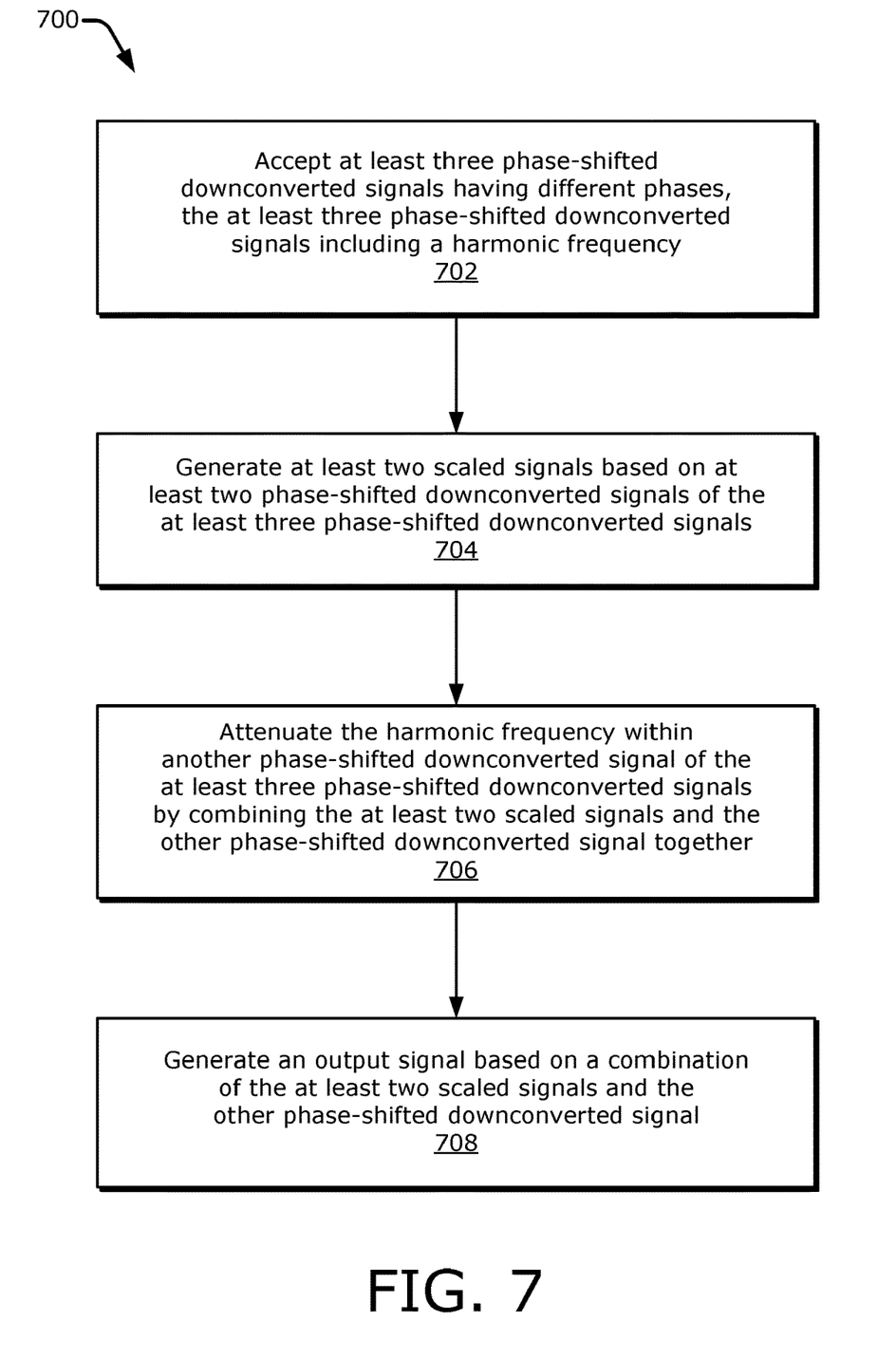
FIG. 7 is a flow diagram illustrating an example process that can be performed at least partially by a harmonic rejection filter with transimpedance amplifiers.

FIG. 7 is a flow diagram illustrating an example process 700 that can be performed at least partially by a harmonic rejection filter with transimpedance amplifiers. The process 700 is described in the form of a set of blocks 702-708 that specify operations that can be performed. However, operations are not necessarily limited to the order shown in FIG. 7 or described herein, for the operations may be implemented in alternative orders or in fully or partially overlapping manners. Operations represented by the illustrated blocks of the process 700 may be performed by a wireless transceiver 120 (e.g., of FIG. 1 or 2) or a mixer 122 (e.g., of FIG. 2 or 3). More specifically, the operations of the process 700 may be performed by a harmonic rejection filter 128 as shown in FIG. 4 or 6.

At block 702, at least three phase-shifted downconverted signals are accepted. The at least three phase-shifted downconverted signals have different phases and include a harmonic frequency. For example, the harmonic rejection filter 128 accepts the at least three phase-shifted downconverted signals 310-1, 310-2, and 310-M of FIG. 4. The phase-shifted downconverted signals 310-1 to 310-M have different phases and include the harmonic frequency 314, as shown in FIG. 3. As an example, the phase-shifted downconverted signals 310-1, 310-2, and 310-M can have phases that differ from the high-frequency signal 208 by 0 degrees, 45 degrees, and 315 degrees, respectively. As another example, the phase-shifted downconverted signals 310-1, 310-2, and 310-M can have phases that differ from the high-frequency signal 208 by 90 degrees, 45 degrees, and 135 degrees, respectively.

At block 704, at least two scaled signals are generated based on at least two phase-shifted downconverted signals of the at least three phase-shifted downconverted signals. For example, the first set 410-1 of transimpedance amplifiers and the scaling current converter 408 generate two scaled signals 412-1 and 412-N based on the phase-shifted downconverted signals 310-2 and 310-M, respectively. In some implementations, the scaled signals 412-1 and 412-N are approximately equal to the corresponding phase-shifted downconverted signals 310-2 and 310-M scaled by a factor that is approximately equal to a reciprocal of a square root of two.

At block 706, the harmonic frequency within another phase-shifted downconverted signal of the at least three phase-shifted downconverted signals is attenuated by combining the at least two scaled signals and the other phase-shifted downconverted signal together. For example, the harmonic rejection filter 128 combines the scaled signals 412-1 and 412-N and the phase-shifted downconverted signal 310-1 at an input of the transimpedance amplifier 406-1 to produce the combined signal 414, as shown in FIG. 4 and represented by Equations 1 or 2. Due to the scaled signals 412-1 and 412-N, the harmonic frequency 314 that is present within the phase-shifted downconverted signal 310-1 is attenuated.

At block 708, an output signal is generated based on a combination of the at least two scaled signals and the other phase-shifted downconverted signal. For example, the transimpedance amplifier 406-1 generates the low-frequency signal 212 based on the combined signal 414. Because the harmonic frequency 314 is attenuated within the combined signal 414, an amplitude of the harmonic frequency 314 within the resulting low-frequency signal 212 is lower than an amplitude of the harmonic frequency 314 within the phase-shifted downconverted signal 310-1. The low-frequency signal 212 can be a low-frequency in-phase signal 212-1 or a low-frequency quadrature signal 212-2, as shown in FIG. 6.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   a harmonic rejection filter including:
      at least three input nodes including a first input node, a second input node, and a third input node;
      at least one output node including a first output node;
      a first transimpedance amplifier coupled between the first input node and the first output node, an input of the first transimpedance amplifier coupled to the first input node via a signal path;
      a first set of transimpedance amplifiers including:
         a second transimpedance amplifier coupled to the second input node; and
         a third transimpedance amplifier coupled to the third input node; and
      a scaling current converter coupled between outputs associated with the first set of transimpedance amplifiers and the input of the first transimpedance amplifier, wherein the signal path does not include the scaling current converter.

2. The apparatus of claim 1, wherein the scaling current converter includes a network of passive components.

3. The apparatus of claim 2, wherein the network of passive components includes:
   a first resistor coupled between an output of the second transimpedance amplifier and the input of the first transimpedance amplifier; and
   a second resistor coupled between an output of the third transimpedance amplifier and the input of the first transimpedance amplifier.

4. The apparatus of claim 3, wherein:
   the at least three input nodes include a fourth input node and a fifth input node;
   the at least one output node includes a second output node;
   the third transimpedance amplifier is coupled to the fifth input node;
   the harmonic rejection filter includes a second set of transimpedance amplifiers, the second set of transimpedance amplifiers including:
      the first transimpedance amplifier; and
      a fourth transimpedance amplifier coupled between the fourth input node and the second output node;
   the scaling current converter is coupled between the outputs associated with the first set of transimpedance amplifiers and inputs associated with the second set of transimpedance amplifiers; and
   the network of passive components includes:
      a third resistor coupled between the output of the second transimpedance amplifier and an input of the fourth transimpedance amplifier; and
      a fourth resistor coupled between another output of the third transimpedance amplifier and the input of the fourth transimpedance amplifier.

5. The apparatus of claim 1, further comprising:
   a multi-phase local oscillator configured to generate at least three phase shifted local oscillator signals; and
   a multi-phase mixer circuit coupled to the multi-phase local oscillator and the at least three input nodes of the harmonic rejection filter, the multi-phase mixer circuit configured to:
      accept a high-frequency signal including a high frequency; and
      generate at least three phase-shifted downconverted signals based on the high-frequency signal and the at least three phase-shifted local oscillator signals, the at least three phase-shifted downconverted signals having different phases, the at least three phase-shifted downconverted signals including a low frequency and a harmonic frequency.

6. The apparatus of claim 5, wherein:
   the at least three phase-shifted local oscillator signals include a local oscillator frequency;
   the harmonic frequency comprises a harmonic of the local oscillator frequency; and
   the low frequency is based on a difference between the high frequency and the local oscillator frequency.

7. The apparatus of claim 5, wherein the at least three phase-shifted local oscillator signals have relatively similar amplitudes.

8. The apparatus of claim 5, wherein the multi-phase mixer circuit includes at least three mixer components, the at least three mixer components comprising:
   at least three double-balanced mixers; or
   at least three single-balanced mixers.

9. The apparatus of claim 5, wherein:
   the first input node is configured to accept, from the multi-phase mixer circuit, a first current associated with a first phase-shifted downconverted signal of the at least three phase shifted downconverted signals;
   the second input node is configured to accept, from the multi-phase mixer circuit, a second current associated with a second phase-shifted downconverted signal of the at least three phase-shifted downconverted signals;
   the third input node is configured to accept, from the multi-phase mixer circuit, a third current associated with a third phase-shifted downconverted signal of the at least three phase-shifted downconverted signals;
   the first set of transimpedance amplifiers is configured to generate two voltages based on the second current and the third current, respectively;
   the scaling current converter is configured to generate two scaled currents based on the two voltages; and
   the first transimpedance amplifier is configured to:
      accept, at the input, the first current from the first input node;

accept, at the input, the two scaled currents from the scaling current converter to attenuate the harmonic frequency associated with the first current; and generate an output voltage based on a combination of the first current and the two scaled currents, the output voltage associated with the low frequency.

10. The apparatus of claim 9, wherein:
the harmonic frequency includes a third-order harmonic frequency;
the first phase-shifted downconverted signal has a first phase that differs from a phase of the high-frequency signal by approximately zero degrees;
the second phase-shifted downconverted signal has a second phase that differs from the phase of the high-frequency signal by approximately 45 degrees; and
the third phase-shifted downconverted signal has a third phase that differs from the phase of the high-frequency signal by approximately 315 degrees;
the scaling current converter is configured to:
  generate a first scaled current of the two scaled currents that is approximately equal to the second current scaled by a factor based on a reciprocal of a square root of two; and
  generate a second scaled current of the two scaled currents that is approximately equal to the third current scaled by the factor based on the reciprocal of the square root of two; and
the first transimpedance amplifier is configured to generate a low-frequency in-phase signal based on the combination of the first current, the first scaled current, and the second scaled current.

11. The apparatus of claim 9, wherein:
the harmonic frequency includes a third-order harmonic frequency;
the first phase-shifted downconverted signal has a first phase that differs from a phase of the high-frequency signal by approximately 90 degrees;
the second phase-shifted downconverted signal has a second phase that differs from the phase of the high-frequency signal by approximately 45 degrees;
the third phase-shifted downconverted signal has a third phase that differs from the phase of the high-frequency signal by approximately 135 degrees;
the scaling current converter is configured to:
  generate a first scaled current of the two scaled currents that is approximately equal to the second current scaled by a factor based on a reciprocal of a square root of two; and
  generate a second scaled current of the two scaled currents that is approximately equal to the third current scaled by the factor based on the reciprocal of the square root of two; and
the first transimpedance amplifier is configured to generate a low-frequency quadrature signal based on the combination of the first current, the first scaled current, and the second scaled current.

12. The apparatus of claim 1, further comprising:
a mixer including:
  at least one input node;
  a multi-phase mixer circuit coupled to the at least one input node and including a first set of mixer components and a second set of mixer components; and
  the harmonic rejection filter,
  wherein the harmonic rejection filter is coupled between the multi-phase mixer circuit and the at least one output node.

13. The apparatus of claim 12, wherein the scaling current converter includes a network of passive components.

14. The apparatus of claim 13, comprising a second set of transimpedance amplifiers including the first transimpedance amplifier, wherein:
the second set of mixer components includes a first mixer component;
the first set of mixer components includes a second mixer component and a third mixer component;
the first transimpedance amplifier is coupled between the first mixer component and the first output node;
the first set of transimpedance amplifiers includes the second transimpedance amplifier coupled to the second mixer component and the third transimpedance amplifier coupled to the third mixer component; and
the network of passive components includes:
  a first resistor coupled between the second transimpedance amplifier and the first transimpedance amplifier; and
  a second resistor coupled between the third transimpedance amplifier and the first transimpedance amplifier.

15. The apparatus of claim 14, wherein:
the at least one output node includes a second output node;
the second set of mixer components includes a fourth mixer component;
the second set of transimpedance amplifiers includes a fourth transimpedance amplifier coupled between the fourth mixer component and the second output node; and
the network of passive components includes:
  a third resistor coupled between the second transimpedance amplifier and the fourth transimpedance amplifier; and
  a fourth resistor coupled between the third transimpedance amplifier and the fourth transimpedance amplifier.

16. The apparatus of claim 12, further comprising a multi-phase local oscillator coupled to the mixer, the multi-phase local oscillator configured to generate multiple phase-shifted local oscillator signals and to provide the multiple phase-shifted local oscillator signals to the mixer, the multiple phase-shifted local oscillator signals having different phase offsets relative to each other, the multiple phase-shifted local oscillator signals comprising a first set of phase-shifted local oscillator signals and a second set of phase-shifted local oscillator signals.

17. The apparatus of claim 16, comprising a second set of transimpedance amplifiers including the first transimpedance amplifier, wherein:
the at least one input node is configured to accept a high-frequency signal;
the first set of mixer components is configured to generate a first set of phase-shifted downconverted signals based on the high-frequency signal and the first set of phase-shifted local oscillator signals;
the second set of mixers is configured to generate a second set of phase shifted downconverted signals based on the high-frequency signal and the second set of phase-shifted local oscillator signals, the first set of phase-shifted downconverted signals and the second set of phase-shifted downconverted signals including a harmonic frequency;
the first set of transimpedance amplifiers and the scaling current converter are jointly configured to generate multiple scaled signals based on the first set of phase-shifted downconverted signals; and the second set of transimpedance amplifiers is configured to attenuate the harmonic frequency that is present within at least one phase-shifted downconverted signal of the second set of phase-shifted downconverted signals by generating an output signal based on a combination of the multiple scaled signals and the at least one phase-shifted downconverted signal of the second set of phase-shifted downconverted signals.

18. The apparatus of claim 17, wherein the output signal comprises a low-frequency in-phase signal having a phase that is relatively similar to another phase of the high-frequency signal, the low-frequency in-phase signal including a low frequency based on a combination of a high frequency of the high frequency signal and a local oscillator frequency of the multiple phase-shifted local oscillator signals.

19. The apparatus of claim 17, wherein the output signal comprises a low-frequency quadrature signal having a phase that differs from another phase of the high-frequency signal by approximately 90 degrees, the low-frequency quadrature signal including a low frequency based on a combination of a high frequency of the high-frequency signal and a local oscillator frequency of the multiple phase-shifted local oscillator signals.

20. The apparatus of claim 17, wherein:
the output signal includes a low frequency and the harmonic frequency; and
an amplitude of the low frequency is greater than another amplitude of the harmonic frequency.

21. An apparatus comprising:
a harmonic rejection filter including:
first means for accepting a first current signal;
second means for accepting a second current signal;
third means for accepting a third current signal;
means for outputting a voltage signal;
first means for generating a voltage signal based on a current signal, the first means for generating coupled to the means for outputting;
a first set of means for generating a voltage signal based on a current signal, inputs of the first set of means for generating being respectively coupled to the second means for accepting and the third means for accepting;
means for converting voltage signals to scaled current signals, the means for converting coupled to outputs of the first set of means for generating; and
means for combining a current signal received at the first means for accepting and the scaled current signals, the means for combining coupled to the first means for generating,
wherein the apparatus is configured such that the current signal received at the first means for accepting is not scaled between the first means for accepting and the means for combining.

* * * * *